United States Patent [19]

Yonezu et al.

[11] Patent Number: 4,638,461
[45] Date of Patent: Jan. 20, 1987

[54] SEMICONDUCTOR MEMORY DEVICE

[75] Inventors: Ryo Yonezu; Kazuhiro Sakashita, both of Itami, Japan

[73] Assignee: Mitsubishi Denki Kabushiki Kaisha, Tokyo, Japan

[21] Appl. No.: 638,678

[22] Filed: Aug. 8, 1984

[30] Foreign Application Priority Data

Aug. 17, 1983 [JP] Japan .................. 58-151263

[51] Int. Cl.$^4$ .......................... G11C 11/40
[52] U.S. Cl. ..................... 365/189; 365/203; 365/230
[58] Field of Search ............ 365/189, 203, 230

[56] References Cited

U.S. PATENT DOCUMENTS 4,300,213 11/1981 Tanimura et al.
4,417,328 11/1983 Ochii

FOREIGN PATENT DOCUMENTS 57-27489 2/1982 Japan.
58-1883 1/1983 Japan.

OTHER PUBLICATIONS

Schlageter et al, "A 4K Static 5-V RAM", 1976 IEEE International Solid-State Circuits Conference, pp. 136-137.

Primary Examiner—Terrell W. Fears
Attorney, Agent, or Firm—Birch, Stewart, Kolasch and Birch

[57] ABSTRACT

A semiconductor memory device, which comprises: a memory cell constituted by MOSFETs; a bit line for transmitting a writing and a reading information to the memory cell therethrough; a writing-in control signal line for controlling the writing operation onto the memory cell; and a writing circuit for transmitting the writing information input from the outside to the bit line at the time of writing but raising the voltage of the bit line up to a power supply voltage at the time of non-writing.

4 Claims, 2 Drawing Figures

SEMICONDUCTOR MEMORY DEVICE

FIELD OF THE INVENTION

The present invention relates to a semiconductor memory device capable of speeding up a writing operation, and minimizing the consumption of electricity.

BACKGROUND OF THE INVENTION

In order to explain the background of the present invention in detail, reference will be made to FIG. 1, which shows a circuit diagram of a prior art semiconductor memory device. There are provided enhancement type MOS field-effect transistors 1,2,3 and 4, hereinafter referred to as MOSFETs. The drains of the P-channel MOSFET 1 and N-channel MOSFET 2 are connected to each other, and the gates thereof are connected to each other. The source of the MOSFET 1 is connected to a power supply terminal 5, and that of the MOSFET 2 is connected to the earth, thus constituting a complementary MOS (hereinafter referred to as CMOS) inverter 30a. Likewise, the P-channel MOSFET 3 and the N-channel MOSFET 4 constitute a CMOS inverter 30b. With these two inverters 30a and 30b a bistable circuit, that is, a flip-flop, is formed. More particularly, the outputs of the two inverters 30a and 30b are connected to the inputs of the mating inverters 30b and 30a. In other words, the drains of the P-channel MOSFETs 1 and 3, and of the N-channel MOSFETs 2 and 4 are connected to the gates of the N-channel MOSFETs 4 and 2, and of the P-channel MOSFETs 3 and 1, respectively. In this way a one bit memory cell 30 is constructed.

The N-channel MOSFETs 6 and 7 which are used for transfer gates to control the writing-in and the reading-out operation, have drains (or sources) connected to the drain of the MOSFETs 1 and 2, and that of the MOSFETs 3 and 4, respectively, and have sources (or drains) connected to bit lines 8 and 9 respectively, which function as information lines for writing-in as well as reading-out. The gates of the N-channel MOSFETs 6 and 7 are connected to a word line 10 which functions as a selector line for writing-in as well as reading-out.

The sources and gates of the N-channel MOSFETs 11 and 12 are connected to power supply terminals 5, and their drains are connected to the bit lines 8 and 9. An information input signal line 13 is connected to the gates of the P-channel MOSFET 14 and N-channel MOSFET 15, which constitute a writing-in circuit 40. In addition, the information input signal line 13 is connected to the drain (or source) of the N-channel MOSFET 16, which is used for a gate to control the information to be written in. The source (or drain) of the MOSFET 16 is connected to the bit line 9, and its gate is connected to a writing-in control signal line 17 which is designed to control the writing operation of the memory cell 30. The drains of the MOSFETs 14 and 15 are connected to the drain (or source) of the N-channel MOSFET 18, which is used for a gate to control the data to be written in. The source (or drain) of the N-channel MOSFET 18 is connected to the bit line 8, and its gate is connected to the writing-in control signal line 17. In this way the MOSFETs 16 and 18 can transmit the output from the writing-in circuit 40 to the bit lines 8 and 9 through between the drain and source thereof.

In operation, the memory cells 30 and the MOSFETs 6, 7 are arrayed in matrix in plurality. A desired memory cell is directly selected by the random access method, in or from which memory cell the data is written or read out. While the memory cell stores data, the word line 10 is kept at almost zero voltage, thereby turning off the MOSFETs 6 and 7. The memory cell 30 constituted by the MOSFETs 1, 2, 3 and 4 is electrically separated from the bit lines 8 and 9. The memory cell 30 is in one of two stable states when the gates of the MOSFETs 1 and 2 are kept "L" (low). At this time the MOSFET 1 is in ON state with its drain being kept "H" (high). Accordingly, the gates of the MOSFETs 3 and 4 become "H", thereby turning on the MOSFET 4 with placing its drain "L".

When the memory cell 30 is in this stable state, information can be written therein by applying voltage corresponding to the information to the bit lines 8 and 9, and applying the voltage "H" to the word line 10 so as to address the memory cell 30.

Now, suppose that the logic "1" is to be written in the memory cell 30. The voltage "H" is applied to the writing-in control signal line 17, thereby turning on the MOSFETs 16 and 18, and the voltage "H" corresponding to the logic "1" is applied to the information input signal line 13. In this way the bit line 9 is kept "H" through the MOSFET 16. In addition, the gates of the MOSFETs 14 and 15 are kept "H", thereby turning off the MOSFET 14 and turning on the MOSFET 15. Thus the drains of the MOSFETs 14 and 15 become "L", thereby placing the bit line 8 "L" through the MOSFET 18.

At this stage, when the word line 10 is placed 37 H38, the MOSFETs 6 and 7 are turned on, thereby enabling the potentials in the bit lines 8 and 9 to be impressed on the memory cell 30. As a result, the MOSFET 1 is turned off whereas the MOSFET 2 is turned on, thereby reversing the states of the MOSFETs 1, 2, and 3, 4. In this way the memory cell 30 enters into the other stable state which means storing the information "1". Subsequently, the word line 10 and the writing-in control signal line 17 are returned to "L". With this the writing operation ends.

When information is to be read out from the memory cell 30, voltage of the same amplitude as that applied while writing-in operation, is impressed on the word line 10, thereby turning on the MOSFETs 6 and 7. This ensures that the electric charges stored in the bit lines 8 and 9 through the MOSFETs 11 and 12 are absorbed by the information stored in the memory cell 30, whereby a potential difference is given to between the bit lines 8 and 9 in accordance with the information stored in the memory cell 30. In this way the stored information is transmitted to the bit lines 8 and 9, and thereafter it is amplified as by a sense amplifier, and is output to the outside.

When this reading operation is to be performed, it is the common practice to pre-charge the bit lines 8, 9 to the "H" voltage through the MOSFETs 11, 12. This is important in preventing an erroneous writing of the information in the bit lines onto the memory cell, which is likely to occur when the MOSFETs 6, 7 are turned on in a situation where the bit lines, having a large parasitic capacity, have information opposite to that stored in the memory cell.

Under the prior art semiconductor memory device mentioned above, the bit lines are constantly charged in spite of the fact that the charging-up is required only when a reading-out operation is to be performed. As a result, the writing information and the electric charges in the bit lines come into collision when information is to be written in. This increases the consumption of electricity, and slows down the operational speeds.

One of prior art methods of controlling the writing and the reading operation is a technique disclosed in the article entitled "4K Static 5 V RAM" by Jeffrey M. Schlageter, Nagab Jayakumar, Joseph H. Kroeger and Vahe Sarkissian, which was prepared for the 1976 International Solid-State Circuit Conference. The article teaches that by disabling the Chip Enable signal, the bit and data lines are equalized to an intermediate voltage of the power supply voltage.

OBJECTS AND SUMMARY OF THE INVENTION

The present invention is directed to solve the problems pointed out with respect to the prior art semiconductor memory device, and has for its object to provide an improved semiconductor memory device capable of minimizing the consumption of electricity, and speeding up the writing operation.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to one aspect of the present invention, there is provided a semiconductor memory device which comprises a memory cell constituted by MOSFETs, a bit line for transmitting writing and reading information to the memory cell therethrough, a writing-in control signal line for controlling the writing operation into the memory cell, and a writing circuit for transmitting the writing information input from the outside to the bit line at the time of writing but raising the voltage of the bit line up to a power supply voltage at the time of non-writing.

DETAILED DESCRIPTION OF THE INVENTION

Figure 1:
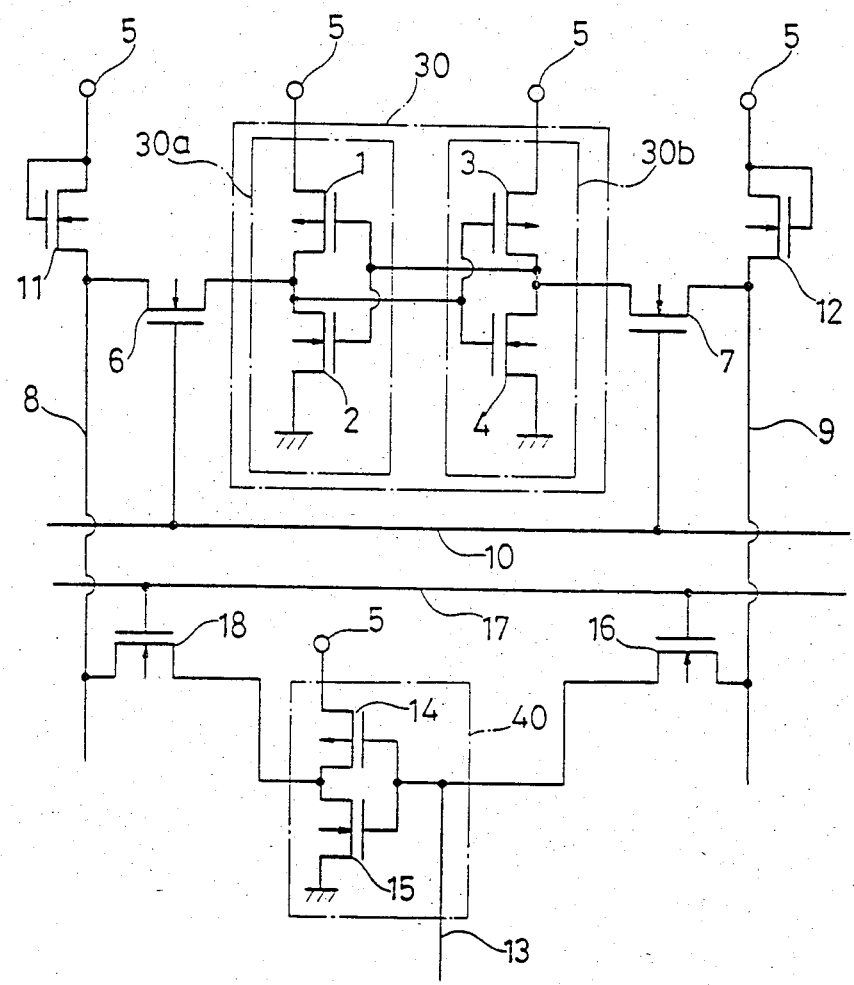
FIG. 1 is a circuit diagram of a main part of a prior art semiconductor memory device.
Figure 2:
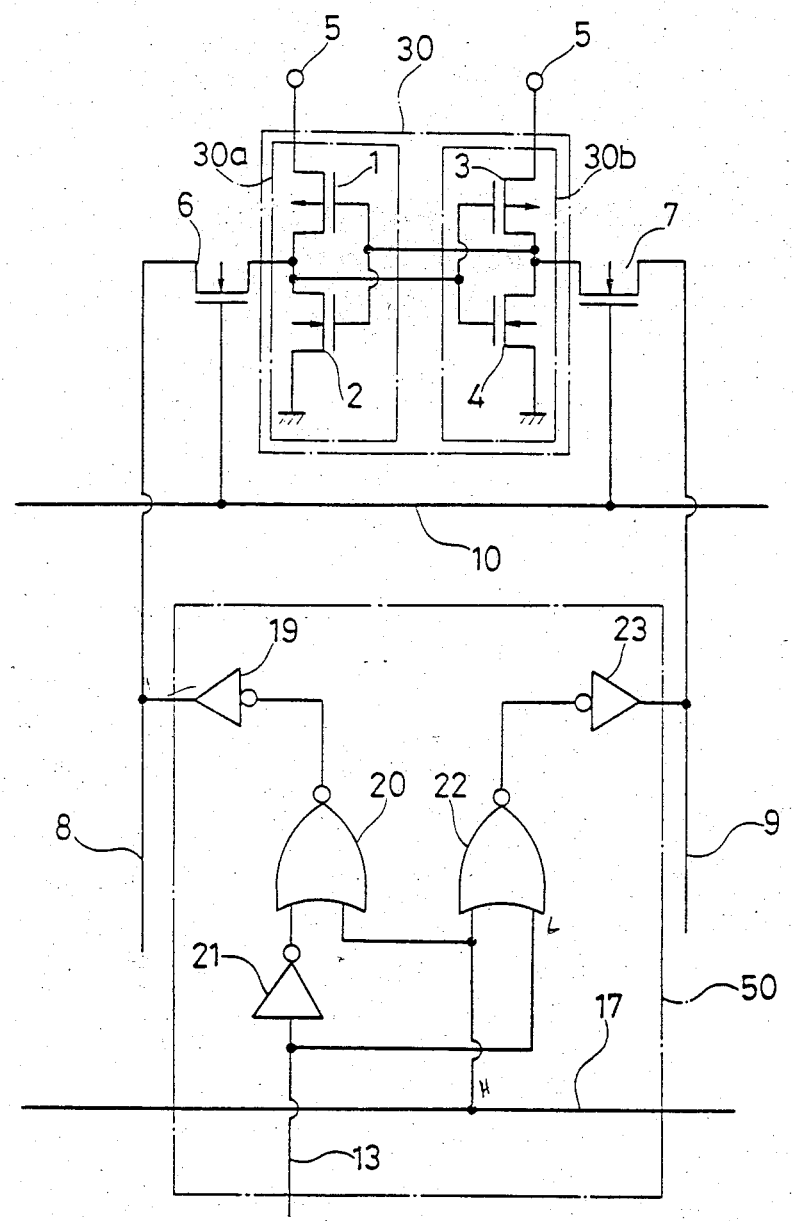
FIG. 2 is a circuit diagram of that part of the semiconductor memory device embodying the present invention which corresponds to the part shown in FIG. 1.

Referring to FIG. 2, wherein like reference numerals to those in FIG. 1 refer to like and corresponding elements, the reference numeral 50 designates a writing-in circuit, in which the output of a CMOS inverter 19 is connected to a bit line 8 with its input being connected to the output of a CMOS NOR gate 20. Likewise, the output of a CMOS inverter 23 is connected to a bit line 9, and its input is connected to the output of a CMOS NOR gate 22. Each of the CMOS NOR gates 20 and 22 has two inputs; one of which is connected to a writing-in control signal line 17. The other input of the CMOS NOR gate 20 is connected to the output of a CMOS inverter 21. The other input of the CMOS NOR gate 22 and the input of the CMOS inverter 21 are connected to an information input signal line 13. The writing-in circuit 50 constructed in this way operates so as to transmit information input from the outside through the information input signal line 13 to the bit lines 8 and 9 at the time of writing and to charge the bit lines 8 and 9 up to the power supply voltage at the time of non-writing.

In operation, now suppose that the voltage of the word line 10 is "L", thereby turning off the MOSFETs 6 and 7, and electrically separating the MOSFETs 1, 2, 3 and 4 from the bit lines 8 and 9, and that the memory cell 30 is in a stable state where the drains of the MOSFETs 1 and 2 are "H" whereas those of the MOSFETs 3 and 4 are "L".

At this stage, when the information "1" is to be written in the memory cell 30, the voltage "H" corresponding to the "1" is applied to the information input signal line 13, and the writing-in control signal line 17 is placed at "L". The CMOS NOR gates 20 and 22 are designed to output a signal which is obtained by inverting the logical sum of the two inputs. Since the two inputs of the CMOS NOR gate 20 are both. "L", its output becomes "H", and it is inverted by the CMOS inverter 19, thereby placing the bit line 8 at "L". Likewise, the voltage "H" is applied to the bit line 9 through the CMOS logic circuits 22 and 23.

In order to complete the writing operation, the voltage "H" is impressed on the word line 10, thereby turning on the MOSFETs 6 and 7. As a result, the gates of the MOSFETs 1 and 2 become "H", and the gates of the MOSFETs 3 and 4 become "L", which leads to the completion of the writing-in of the information "1" in the memory cell 30. The writing operation ends up with restoring the word line 10 to the state "L", and the writing-in control signal line 17 to the state "H".

When the stored information is to be read out, the voltage "H" and "L" are impressed on the writing-in control signal line 17 and the word line 10, respectively. The voltage "H" applied to the line 17 is equally impressed on the bit lines 8 and 9 through the CMOS NOR gates 20, 22 and the CMOS inverters 19, 23. At this stage, by raising the word line 10 to "H", the MOSFETs 6 and 7 are turned on, and the electric charges of the bit lines 8 and 9 are absorbed in accordance with the information stored in the memory cell 30, whereby the stored information is allowed to be transmitted to the bit lines 8 and 9. The transmitted information in the bit lines 8 and 9 is amplified as by a sense amplifier not shown in the figure, and is output to the outside.

In the foregoing description a general purpose random read/write memory device has been referred to as an example, but the present invention is not limited to it.

The present invention is readily embodied in a large-scale integration of a CMOS type gate array which has a sense amplifier and a writing circuit in each column having a fixed pattern. In this case the speeding-up of the operation and the reducing of electricity consumption are particularly enhanced.

According to the present invention, the bit lines are charged up through the writing-in circuit whereby information is transmitted thereto, and the charging-up is performed in accordance with the information in the writing-in control signal line only when no writing-in is performed in the memory cell. As a result, no collision occurs between the information to be written in the memory cell and the voltage for charging the bit lines, thereby ensuring that the writting operation considerably speeds up, and the consumption of electricity is minimized.

What is claimed is:

1. A semiconductor memory device, which
a memory cell constituted by MOSFETs;

a bit line for transmitting writing and reading information to or from the memory cell therethrough;

a writing-in control signal line for controlling the writing operation into the memory cell in response to a write-in signal; and writing circuit means for transmitting the writing information to the bit line from an external source at the time of a writing operation as indicated by the write-in signal and charging the voltage of the bit line up to a power supply voltage when the write-in signal indicates a time of non-writing placing the bit line in a reading mode.

2. A semiconductor memory device as defined in Claim 1, wherein the number of bit lines provided for the memory cell is equal to two, and wherein said writing circuit means comprises a first, a second, and a third inverter, and a first and a second 2-input NOR gates; where the first inverter receives writing data from an external source at its input, the first NOR gate receives the output of the first inverter at a first input and the writing-in signal at a second input, the second NOR gate receives the writing data at a first input and the writing-in signal at a second input, the second inverter receives an output of the first NOR gate as an input and outputs to a first one of the bit lines, and the third inverter receives an output of the second NOR gate as an input and outputs to a second one of the bit lines.

3. A semiconductor device with the ability to write data into storage and read data out of storage, comprising:

memory cell, said memory cell having a plurality of input/output lines, each of said input/output lines for inputting data into and outputting data from said memory cell;

a plurality of data bit lines for transmitting data to and from said memory cell, said plurality of data bit lines corresponding to said input/output lines in a one-to-one manner;

a plurality of transfer control means, one of said transfer control means connected between each of said data bit lines and said input/output lines, for controlling a flow of data between said bit lines and said input/output lines; and writing circuit means, connected to each of said data bit lines and responsive to a write-in signal, for writing data onto selected ones of said bit lines from an external source when said write-in signal is indicative of a writing operation and charging all of said bit lines and placing the bit lines in a reading mode when said write-in signal is indicative of no writing operation.

4. The semiconductor device of claim 2, wherein said plurality of transfer control means includes a plurality of MOSFETs of a first conductivity type having a first and second control terminal and a gate, with the number of said MOSFETs corresponding to the number of said input/output lines in a one-to-one manner with each MOSFET being arranged so that said first control terminal is connected to one of said input/output lines and its second control terminal is connected to one of said data bit lines and a word line is connected to the gate of each of said MOSFET's for turning ON MOSFETs, and thereby transferring data between said bit lines and said input/output lines, only during a writing-in or reading out operation that is to be carried out using said memory cell.

* * * * *